US010725088B2

(12) United States Patent
Kim et al.

(10) Patent No.: US 10,725,088 B2
(45) Date of Patent: Jul. 28, 2020

(54) APPARATUS FOR ESTIMATING LIFETIME OF THE SPD USING DISCHARGE CHARACTERISTICS OF THE MOV

(71) Applicant: SUNKWANG LIGHTNING PROTECTION TECHNICAL INSTITUTE INC., Seoul (KR)

(72) Inventors: Dong-Jin Kim, Seoul (KR); Won-Sung Kwon, Seoul (KR); Yong-Su Kim, Seoul (KR); Jae-Hyo Park, Seoul (KR); Kyung-Hoon Jang, Seoul (KR); Kwang-Yeop Jang, Gyeonggi-do (KR); Dong-Hyun Kim, Seoul (KR); Sang-Won Seo, Seoul (KR); Byeong-U Kim, Seoul (KR); Hee-Soo Park, Gyeonggi-do (KR)

(73) Assignee: Sunkwang Lightning Protection Technical Institute Inc., Seoul (KR)

( * ) Notice: Subject to any disclaimer, the term of this patent is extended or adjusted under 35 U.S.C. 154(b) by 162 days.

(21) Appl. No.: 15/989,723

(22) Filed: May 25, 2018

(65) Prior Publication Data

US 2019/0353694 A1 Nov. 21, 2019

(30) Foreign Application Priority Data

May 15, 2018 (KR) .................. 10-2018-0055620

(51) Int. Cl.
*G01R 31/26* (2020.01)
*G01R 31/327* (2006.01)
*H02H 9/04* (2006.01)

(52) U.S. Cl.
CPC ..... *G01R 31/2637* (2013.01); *G01R 31/2601* (2013.01); *G01R 31/3277* (2013.01); *H02H 9/042* (2013.01)

(58) Field of Classification Search
CPC ............ G01R 31/2637; G01R 31/2601; G01R 31/3277; H02H 9/042
See application file for complete search history.

(56) References Cited

U.S. PATENT DOCUMENTS 6,477,025 B1 * 11/2002 Goldbach .............. H02H 9/042
337/159
7,453,368 B2 * 11/2008 Baldwin .............. H02H 1/0053
338/21

(Continued)

FOREIGN PATENT DOCUMENTS

KR 101253229 4/2013
KR 101303202 9/2013

*Primary Examiner* — Tung X Nguyen
*Assistant Examiner* — Feba Pothen
(74) *Attorney, Agent, or Firm* — IPLA P.A.; James E. Bame

(57) ABSTRACT

An apparatus for estimating the lifetime of a surge protective device (SPD) using the discharge characteristics of a metal oxide varistor (MOV) includes an MOV having an input terminal and an output terminal; an impulse voltage application unit applying an impulse voltage for MOV test to the input terminal of the MOV; a discharge current measurement unit; a first switching unit connecting a power line to the input terminal of the MOV; a second switching unit connecting a ground line to the output terminal of the MOV in the normal mode and selectively connecting the discharge current measurement unit in the MOV test mode; an MOV test management unit providing information; a discharge current check unit generating an MOV abnormal signal; and an MOV state display unit displaying an MOV abnormal signal.

7 Claims, 2 Drawing Sheets

(56) References Cited

U.S. PATENT DOCUMENTS

| | | | |
|---|---|---|---|
| 9,784,785 B2* | 10/2017 | Farquhar, III | G01R 31/2827 |
| 2008/0218925 A1* | 9/2008 | Ioannou | H02H 9/042 |
| | | | 361/111 |
| 2009/0207034 A1* | 8/2009 | Tinaphong | H02H 9/042 |
| | | | 340/635 |
| 2009/0287108 A1 | 11/2009 | Levy | |
| 2016/0028226 A1* | 1/2016 | Kuo | H02H 9/044 |
| | | | 361/118 |
| 2016/0313389 A1* | 10/2016 | Wilson | H02H 9/042 |

* cited by examiner

APPARATUS FOR ESTIMATING LIFETIME OF THE SPD USING DISCHARGE CHARACTERISTICS OF THE MOV

CROSS REFERENCE

The present application claims the benefit of Korean Patent Application No. 10-2018-0055620 filed May 15, 2018 with the Korean Intellectual Property Office, the entire contents of which are incorporated herein by reference.

BACKGROUND

The present invention relates to an apparatus for estimating the lifetime of a surge protective device (SPD) using the discharge characteristics of a metal oxide varistor (MOV), which can check the damage state of the MOV by applying an impulse voltage to the MOV and checking the discharge current of the MOV.

With the recent development of the data communication technology, electronic devices directly connected to an external communication line for transmitting/receiving data have suddenly increased. Accordingly, there is a great need for an overvoltage protective device for preventing the failure of an electronic device attributable to the influence of surge flowing into the electronic device.

A known overvoltage protective device includes an SPD for preventing an overvoltage from being applied to an electronic device due to surge. The SPD includes various elements, such as an MOV. The SPD is gradually damaged when an overvoltage, such as surge, continues to flow into the SPD, and stops operating at a specific point of time. Accordingly, an external electronic device connected to the SPD cannot be normally protected, and an electronic device may be directly damaged by a transient voltage/current.

That is, when a surge voltage of a protection capacity or more is input to the SPD, elements are frequently damaged and shorted. Accordingly, although the lifespan of the SPD has expired, the replace time of the SPD is missed because whether the SPD has been damaged cannot be checked with the naked eye, thereby damaging equipment.

In Korean Patent No. 10-1253229, the short circuit of an MOV is detected and an SPD indicates the short circuit using an LED. However, the conventional technology has a problem in that equipment is damaged when surge is received because whether the SPD has failed cannot be checked if the SPD is not shorted, but is partially damaged.

Furthermore, in Korean Patent No. 10-1303202, received energy is checked based on the amount and number of surge currents, and a failure rate of an SPD is estimated. However, the conventional technology has problems in that an error rate of input surge current measurement becomes an important factor and an excellent CT must be provided for the error rate.

SUMMARY OF THE INVENTION

An embodiment of the present invention provides an apparatus for estimating the lifetime of an SPD using the discharge characteristics of an MOV, which can check the damage state of the MOV by applying an impulse voltage to the MOV and checking the discharge current of the MOV.

An apparatus for estimating the lifetime of an SPD using the discharge characteristics of an MOV according to an embodiment of the present invention includes an MOV 100 having an input terminal 11 and an output terminal 12; an impulse voltage application unit 20 having one end connected to external power supplied to an SPD and the other end selectively connected to the input terminal 11 of the MOV, wherein when the MOV is tested, the impulse voltage application unit 20 applies an impulse voltage for an MOV test to the input terminal 11 of the MOV; a discharge current measurement unit 30 selectively connected to the output terminal 12 of the MOV and measuring a discharge current output from the output terminal 12 of the MOV when the MOV is tested; a first switching unit 40 connecting a power line to the input terminal 11 of the MOV when the MOV is a normal mode and selectively connecting the impulse voltage application unit 20 to the input terminal 11 of the MOV when the MOV is an MOV test mode; a second switching unit 50 connecting a ground line to the output terminal 12 of the MOV in the normal mode and selectively connecting the discharge current measurement unit 30 to the output terminal 12 of the MOV in the MOV test mode; an MOV test management unit 60 providing information about the normal mode or test mode of the MOV 10 to the first switching unit 40 and the second switching unit 50 and performing control so that the impulse voltage application unit 20 generates an impulse voltage in the test mode; a discharge current check unit 70 comparing a discharge current measured by the discharge current measurement unit 30 with a reference current and generating an MOV abnormal signal when the measured discharge current is lower than the reference current; and an MOV state display unit 80 positioned on an external surface of the SPD and displaying an MOV abnormal signal when the MOV abnormal signal is generated by the discharge current check unit 70.

Preferably, the discharge current measurement unit 30 stores the measured discharge current.

Preferably, the MOV test management unit 60 stores a test cycle so that the MOV 10 is regularly tested.

Preferably, the MOV test management unit 60 receives a test mode signal of the MOV 10 from an external management center and controls the first switching unit 40 and the second switching unit 50.

Preferably, the MOV abnormal signal differently generates a caution signal or a warning signal depending on the degree that the discharge current deviates from the reference current.

Preferably, the apparatus further includes an external notification unit 90 providing an MOV abnormal signal to a wireless terminal of a registered administrator or a management center along with unique ID information of the SPD when the MOV abnormal signal is generated by the discharge current check unit 70.

Preferably, the external notification unit 90 further provides the discharge current measured by the discharge current measurement unit 30.

DETAILED DESCRIPTION OF THE INVENTION

Hereinafter, an apparatus for estimating the lifetime of an SPD using the discharge characteristics of an MOV according to an embodiment of the present invention is described in detail with reference to the accompanying drawings.

Figure 1:
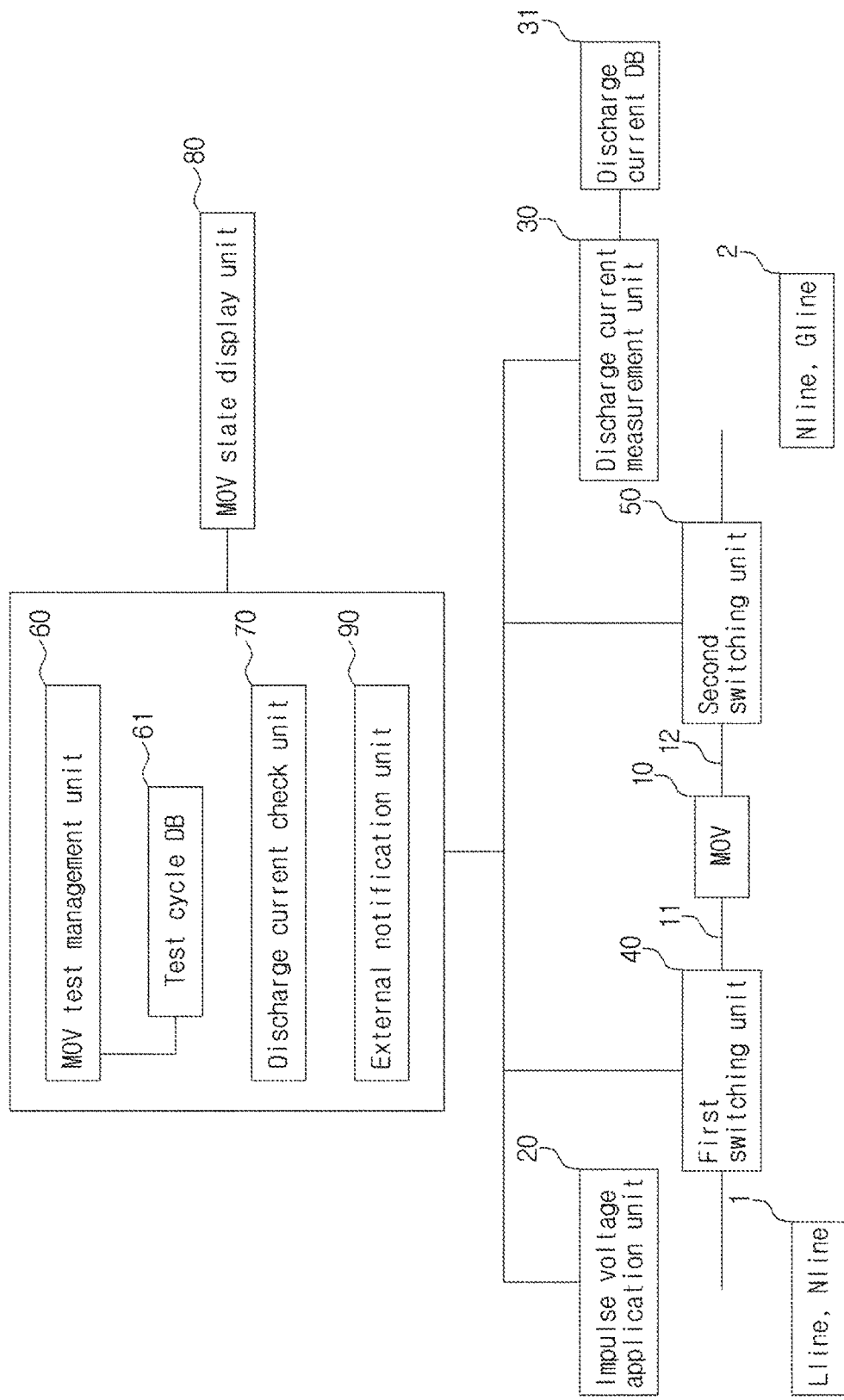
FIG. 1 is a block diagram of an apparatus for estimating the lifetime of an SPD using the discharge characteristics of an MOV according to an embodiment of the present invention.

As shown in FIG. 1, in the apparatus for estimating the lifetime of an SPD using the discharge characteristics of an MOV according to an embodiment of the present invention, an overvoltage/current is input to one side of the apparatus, and an SPD to which an external electronic device is connected is located on the other side of the apparatus. The apparatus for estimating the lifetime of an SPD includes an MOV 10, an impulse voltage application unit 20, a discharge current measurement unit 30, a first switching unit 40, a second switching unit 50, an MOV test management unit 60, a discharge current check unit 70, an MOV state display unit 80, and an external notification unit 90.

The MOV 10 is used for protection against a surge voltage or overvoltage, and includes an input terminal 11 and an output terminal 12. When power of a specific level or more is applied through the input terminal 11, the power is conducted to the ground through the output terminal 12. At normal times, the MOV 10 is connected to a power line (L line) and a neutral line (N line) or connected to the power line (L line) and a ground line (G line) or connected to the neutral line (N line) and a ground line (G line), thus being capable of detecting all of overvoltage received through the lines.

The impulse voltage application unit 20 has one end connected to external power supplied to an SPD and the other end selectively connected to the input terminal 11 of the MOV. When the MOV is tested, the impulse voltage application unit 20 applies an impulse voltage for an MOV test to the input terminal 11 of the MOV. When an instant impulse voltage is applied, the impulse voltage application unit 20 can check a discharge current output from the output terminal of the MOV. When the discharge current is gradually lowered, the impulse voltage application unit 20 can check the replacement time of the MOV.

The discharge current measurement unit 30 is selectively connected to the output terminal 12 of the MOV, and measures a discharge current output from the output terminal 12 of the MOV when the MOV is tested. At this time, the discharge current measurement unit 30 may store the measured discharge current in a discharge current DB 31.

When the MOV 10 is a normal mode, the first switching unit 40 connects the power line to the input terminal 11 of the MOV. When the MOV 10 is an MOV test mode, the first switching unit 40 selectively connects the impulse voltage application unit 20 to the input terminal 11 of the MOV. In the normal mode, the first switching unit 40 connects the power line to the input terminal 11 of the MOV so that the MOV 10 can handle a surge current. In the MOV test mode, the power line connected to the input terminal 11 of the MOV is blocked, and the input terminal 11 of the MOV is connected to the impulse voltage application unit 20.

In the normal mode, the second switching unit 50 connects the ground line to the output terminal 12 of the MOV. In the MOV test mode, the second switching unit 50 selectively connects the discharge current measurement unit 30 to the output terminal 12 of the MOV. In the normal mode, the second switching unit 50 connects the output terminal 12 of the MOV to the ground line so that the MOV 10 can handle a surge current. In the MOV test mode, the output terminal 12 of the MOV is connected to the discharge current measurement unit 30.

The MOV test management unit 60 provides information about the normal mode or test mode of the MOV 10 to the first switching unit 40 and the second switching unit 50. When the MOV 10 is the test mode, the MOV test management unit 60 performs control so that the impulse voltage application unit 20 generates an impulse voltage. The MOV test management unit 60 includes a test cycle DB 61 in which a month, week, date, and time are stored so that the MOV 10 is regularly tested. Accordingly, the MOV test management unit 60 controls the first switching unit 40 and the second switching unit 50 by periodically generating a test mode signal or may receive the test mode signal of the MOV 10 from an external management center and control the first switching unit 40 and the second switching unit 50.

The discharge current check unit 70 compares a discharge current measured by the discharge current measurement unit 30 with a reference current, and generates an MOV abnormal signal when the measured discharge current is lower than the reference current. That is, when the MOV is used and surge is input, a discharge current corresponding to an impulse voltage when the MOV is the test mode is gradually lowered. When the discharge current is lower than a reference discharge current, the discharge current check unit 70 determines that the MOV has been damaged and generates the MOV abnormal signal. The discharge current check unit 70 may differently generate a caution signal or a warning signal depending on the degree that the measured discharge current has deviated from the reference discharge current. Accordingly, the state of the MOV 10 can be checked based on the amount of the discharge current.

The MOV state display unit 80 is positioned on an external surface of the SPD, and displays the MOV abnormal signal so that it can be checked outside when the MOV abnormal signal is generated by the discharge current check unit 70. In this case, the MOV state display unit 80 may be an LED. The MOV state display unit 80 may be displayed in green when the MOV abnormal signal is not generated, may be displayed in orange when the MOV abnormal signal is the caution signal, and may be displayed in red when the MOV abnormal signal is the warning signal. In this case, the MOV state display unit 80 may display the amount of a discharge current on the external surface of the SPD.

When the MOV abnormal signal is generated by the discharge current check unit 70, the external notification unit 90 provides the MOV abnormal signal to the wireless terminal of a registered administrator or a management center along with unique ID information of the SPD. In this case, the external notification unit 90 may also provide a discharge current measured by the discharge current measurement unit 30. Accordingly, an external management center that manages multiple SPDs can easily check the state of the installation location of the SPD and replace the MOV 10.

Figure 2:
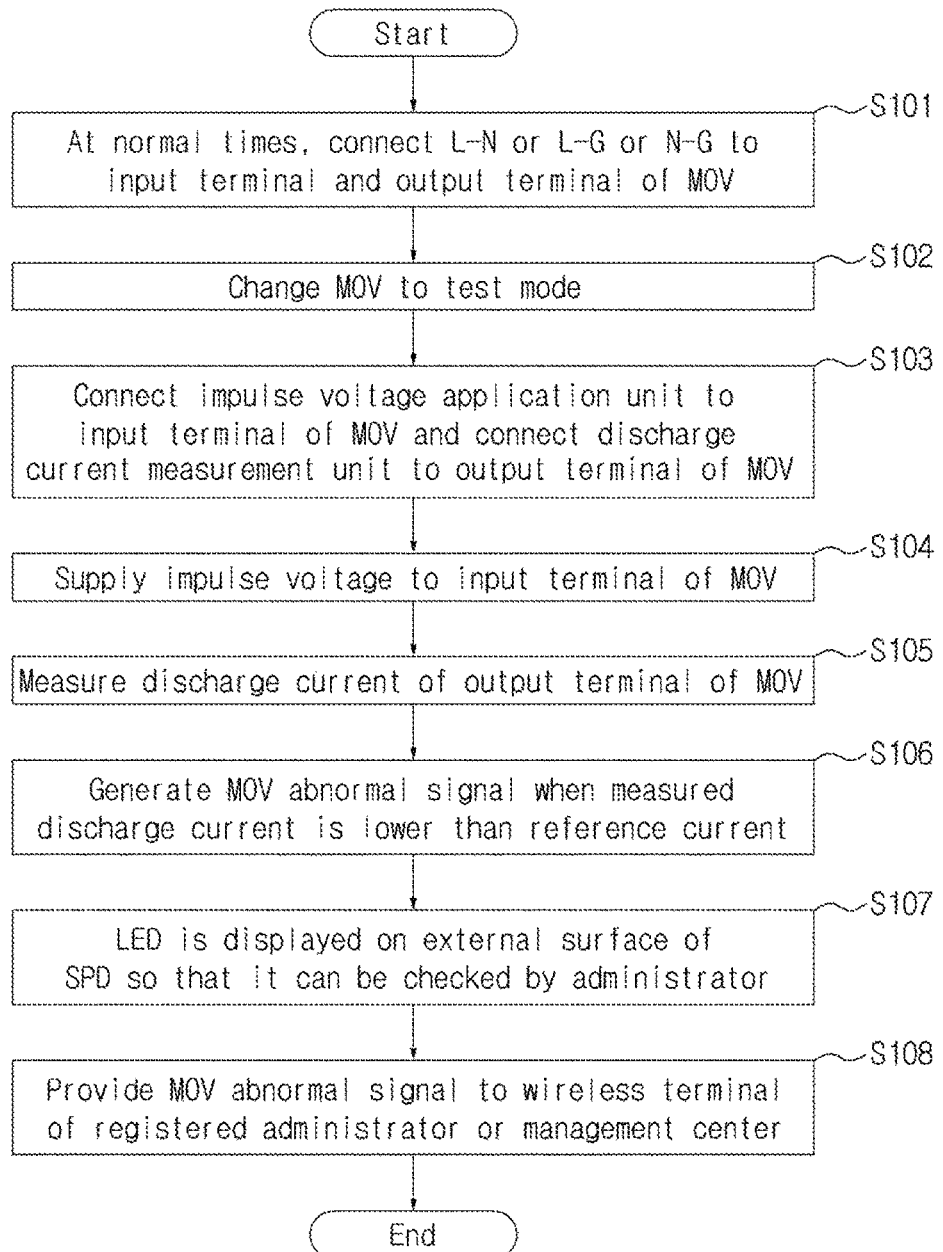
FIG. 2 is a flowchart showing an operational process of the apparatus for estimating the lifetime of an SPD using the discharge characteristics of an MOV according to an embodiment of the present invention.

An operational process of the apparatus for estimating the lifetime of an SPD using the discharge characteristics of an MOV according to an embodiment of the present invention is described in detail below with reference to a flowchart of FIG. 2.

At normal times, the MOV test management unit 60 controls the first switching unit 40 and the second switching unit 50 so that the MOV 10 is connected to the power line (L line) and the neutral line (N line), connected to the power line (L line) and the ground line (G line) or connected to the neutral line (N line) and the ground line (G line) so that the MOV 10 of the SPD can handle a surge current, thereby being capable of detecting an overvoltage (S101).

When the test time of the MOV 10 registered with the test cycle DB 61 is reached or the test mode signal of the MOV 10 is received from an external management center, the MOV test management unit 60 changes the first switching unit 40 and the second switching unit 50 to the MOV test mode (S102). Accordingly, the MOV test management unit 60 connects the impulse voltage application unit 20 to the input terminal 11 of the MOV and connects the discharge current measurement unit 30 to the output terminal 12 of the MOV (S103).

Thereafter, when an impulse voltage generated by the impulse voltage application unit 20 is supplied to the input terminal 11 of the MOV (S104), the discharge current measurement unit 30 connected to the output terminal 12 of the MOV measures a discharge current (S105). The discharge current check unit 70 compares the measured discharge current measured with a reference current, and generates the MOV abnormal signal when the measured discharge current is lower than the reference current (S106). In this case, the MOV abnormal signal is classified as a caution signal or a warning signal depending on the degree that the measured discharge current has deviated from the reference current.

When the MOV abnormal signal is generated, the LED of the MOV state display unit 80 positioned on an external surface of the SPD is displayed so that it can be checked by an administrator (S107). In this case, the LED is displayed in orange when the MOV abnormal signal is the caution signal, and is displayed in red when the MOV abnormal signal is the warning signal.

When the MOV abnormal signal is generated, it is provided to the wireless terminal of a registered administrator or a management center along with unique ID information of the SPD so that the state of the MOV 10 can be checked by the administrator or the management center (S108).

The apparatus for estimating the lifetime of an SPD using the discharge characteristics of an MOV according to an embodiment of the present invention has an advantage in that it can precisely check the state of the MOV by applying an impulse voltage to the MOV and checking a discharge current of the MOV. That is, if a higher discharge current than that in an initial state is measured in the MOV, it may be seen that the MOV is damaged.

Furthermore, at normal times, the L-N or L-G or N-G is connected to the input terminal and output terminal of the MOV so that the MOV can handle a surge current. The impulse voltage application unit and the discharge current measurement unit are connected to the input terminal and output terminal of the MOV only when the MOV is tested. Accordingly, there is an advantage in that the MOV can be tested while not affecting the operation of the MOV.

Furthermore, an error of a discharge current output from the output terminal of the MOV can be minimized compared to a case where a voltage is continuously applied to the MOV because an impulse voltage is applied to the MOV.

As described above, although the present invention has been described in connection with the limited embodiments and drawings, the present invention is not limited to them, and a person having ordinary skill in the art to which the present invention pertains will appreciate that various modifications, additions and substitutions are possible without departing from the scope and spirit of the invention as disclosed in the accompanying claims.

What is claimed is:

1. An apparatus for estimating a lifetime of a surge protective device (SPD) using discharge characteristics of a metal oxide varistor (MOV), the apparatus, comprising:

an MOV having an input terminal and an output terminal;

an impulse voltage application unit having a first end connected to an external power supplied to the SPD and a second end selectively connected to the input terminal of the MOV, wherein when the MOV is tested, the impulse voltage application unit applies an impulse voltage for an MOV test to the input terminal of the MOV;

a discharge current measurement unit selectively connected to the output terminal of the MOV and measuring a discharge current output from the output terminal of the MOV when the MOV is tested;

a first switching unit connecting a power line to the input terminal of the MOV when the MOV is a normal mode and selectively connecting the impulse voltage application unit to the input terminal of the MOV when the MOV is an MOV test mode;

a second switching unit connecting a ground line to the output terminal of the MOV in the normal mode and selectively connecting the discharge current measurement unit to the output terminal of the MOV in the MOV test mode;

an MOV test management unit providing information about the normal mode or test mode of the MOV to the first switching unit and the second switching unit and performing control so that the impulse voltage application unit generates the impulse voltage in the test mode;

a discharge current check unit comparing the discharge current measured by the discharge current measurement unit with a reference current and generating an MOV abnormal signal when the measured discharge current is lower than the reference current; and an MOV state display unit positioned on an external surface of the SPD and displaying the MOV abnormal signal when the MOV abnormal signal is generated by the discharge current check unit.

2. The apparatus of claim 1, wherein the discharge current measurement unit stores the measured discharge current.

3. The apparatus of claim 1, wherein the MOV test management unit stores a test cycle so that the MOV is regularly tested.

4. The apparatus of claim 1, wherein the MOV test management unit receives a test mode signal of the MOV from an external management center and controls the first switching unit and the second switching unit.

5. The apparatus of claim 1, wherein the MOV abnormal signal differently generates a caution signal or a warning signal depending on a degree that the discharge current deviates from the reference current.

6. The apparatus of claim 1, further comprising an external notification unit providing the MOV abnormal signal to a wireless terminal of a registered administrator or a management center along with unique ID information of the SPD when the MOV abnormal signal is generated by the discharge current check unit.

7. The apparatus of claim 6, wherein the external notification unit further provides the discharge current measured by the discharge current measurement unit.

* * * * *